(12) United States Patent
Jang (10) Patent No.: US 8,455,343 B2
(45) Date of Patent: Jun. 4, 2013

(54) SEMICONDUCTOR DEVICE WITH BURIED GATE AND METHOD FOR FABRICATING THE SAME

(75) Inventor: Se-Aug Jang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 189 days.

(21) Appl. No.: 12/832,748

(22) Filed: Jul. 8, 2010

(65) Prior Publication Data

US 2011/0024833 A1 Feb. 3, 2011

(30) Foreign Application Priority Data

Jul. 31, 2009 (KR) .................. 10-2009-0070992

(51) Int. Cl.
*H01L 29/78* (2006.01)
*H01L 21/336* (2006.01)

(52) U.S. Cl.
USPC ........... 438/589; 438/270; 438/424; 257/330; 257/333; 257/334; 257/383; 257/E21.409; 257/E21.429; 257/E21.432; 257/E29.262

(58) Field of Classification Search
USPC .................. 438/270, 424, 589; 257/330, 333, 257/334, 383, E21.409, E21.42, E21.432, 257/E29.262
See application file for complete search history.

(56) References Cited

U.S. PATENT DOCUMENTS

| 2002/0130358 | A1 | 9/2002 | Van Dalen et al. | |
|---|---|---|---|---|
| 2008/0079070 | A1* | 4/2008 | Seo et al. | 257/333 |
| 2008/0191288 | A1* | 8/2008 | Kwon et al. | 257/383 |
| 2010/0163976 | A1* | 7/2010 | Lee et al. | 257/330 |

FOREIGN PATENT DOCUMENTS

| KR | 1020080016327 | 2/2008 |
|---|---|---|
| KR | 1020090002655 | 1/2009 |

OTHER PUBLICATIONS

Notice of Allowance issued by the Korean Intellectual Property Office on Jul. 9, 2012.

* cited by examiner

*Primary Examiner* — Dao H Nguyen
(74) *Attorney, Agent, or Firm* — IP & T Group LLP (57) ABSTRACT

A semiconductor device includes a first region and a second region, a buried gate arranged in the first region, and an oxidation prevention barrier surrounding the first region.

22 Claims, 13 Drawing Sheets

SEMICONDUCTOR DEVICE WITH BURIED GATE AND METHOD FOR FABRICATING THE SAME

CROSS-REFERENCE TO RELATED APPLICATIONS

The present application claims priority of Korean Patent Application No. 10-2009-0070992, filed on Jul. 31, 2009, which is incorporated herein by reference in its entirety.

BACKGROUND OF THE INVENTION

Exemplary embodiments of the present invention relate to a semiconductor device, and more particularly, to a semiconductor device with a buried gate and a method for fabricating the same.

Recent fabrication processes of semiconductor devices, such as dynamic random access memory (DRAM), have been developed to increase integration density. A variety of methods have been attempted to ensure the reliability of the semiconductor devices, while increasing the integration density of the semiconductor devices through the fabrication of a buried gate. A buried gate may also be referred to as a buried word line.

A buried gate can remarkably reduce a parasitic capacitance between a word line and a bit line by burying a gate or a word line within a semiconductor substrate. Accordingly, the application of a buried gate can greatly improve the reliability of a voltage sensing operation of a semiconductor device.

Meanwhile, in a semiconductor device including a buried gate, where there is a relatively small horizontal space for the buried gate, a double-layer structure in which a low-resistance metal layer is disposed on the polysilicon layer cannot be used. Therefore, in fabricating a buried gate, a low-resistance metal layer may be used as a gate electrode, without forming a polysilicon layer on a gate dielectric layer.

Figure 1:
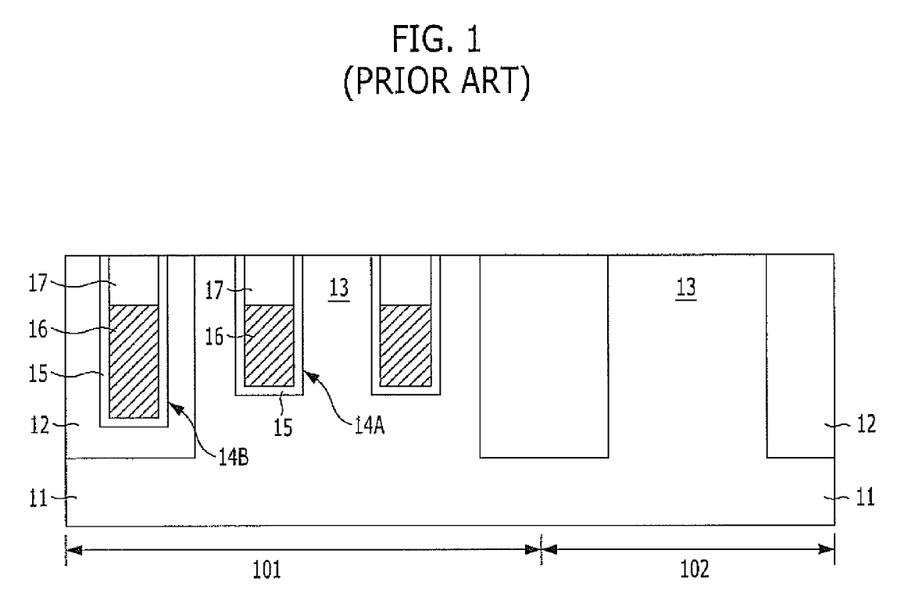
FIG. 1 is a cross-sectional view illustrating a conventional semiconductor device with a buried gate.

FIG. 1 is a cross-sectional view illustrating a conventional semiconductor device with a buried gate.

Referring to FIG. 1, the conventional semiconductor device may include a semiconductor substrate 11 in which a first region 101 and a second region 102 are defined. The first region 101 is a memory cell region, and the second region 102 is a peripheral circuit region.

Isolation layers 12 may be formed in the first region 101 and the second region 102 in order to isolate elements formed in the respective regions. The isolation layers 12 define a plurality of active regions 13 in the respective regions.

In the first region 101, the active region 13 and the isolation layer 12 may be simultaneously etched to form an active region trench 14A and an isolation layer trench 14B. Subsequently, buried gates 16, partially filling the active region trench 14A and the isolation layer trench 14B, may be formed. That is, the buried gates 16 may be formed in a portion of the active region trench 14A formed in the active region 13 and also may be formed in a portion of the isolation layer trench 14B formed in the isolation layer 12. Since the active region trench 14A and the isolation region trench 14B may be formed by simultaneously etching the active region 13 and the isolation layer 12, they may extend in the same direction.

Further, interlayer dielectric layers 17 may be formed on the buried gates 16 to gap-fill the remaining portions of the active region trench 14A and the isolation layer trench 14B.

Moreover, gate dielectric layers 15 may be formed between the buried gates 16 and the active region trench 14A and the isolation layer trench 14B.

In the conventional semiconductor device described above, there is a concern regarding the characteristics of the buried gates 16. Although not shown, the buried gates 16 may be degraded during a variety of subsequent thermal processes, such as an oxidation process.

SUMMARY OF THE INVENTION

Exemplary embodiments of the present invention are directed to a semiconductor device, which is capable of preventing buried gates from being degraded during a subsequent thermal process, such as an oxidation process, and a method for fabricating the same.

In accordance with an exemplary embodiment of the present invention, a semiconductor device includes a first region and a second region, a buried gate arranged in the first region, and an oxidation prevention barrier surrounding the first region.

In accordance with another exemplary embodiment of the present invention, a semiconductor device includes a first region and a second region, a buried gate arranged in the first region, an oxidation prevention barrier surrounding the first region, and an oxidation prevention layer covering an upper portion of the first region.

In accordance with yet another exemplary embodiment of the present invention, a method for fabricating a semiconductor device includes preparing a substrate having a first region and a second region, forming an oxidation prevention barrier surrounding the first region, and forming a buried gate in the first region.

In accordance with still another exemplary embodiment of the present invention, a method for fabricating a semiconductor device includes preparing a substrate having a first region and a second region, forming an oxidation prevention barrier surrounding the first region, forming a buried gate in the first region, and forming an oxidation prevention layer covering an upper portion of the first region.

The first region may include a memory cell region, and the second region may include a peripheral circuit region. The oxidation prevention barrier may include silicon, and the oxidation prevention barrier may have a width ranging from approximately 1 nm to approximately 300 nm. The oxidation prevention layer may include a nitride layer.

DESCRIPTION OF SPECIFIC EMBODIMENTS

Exemplary embodiments of the present invention will be described below in more detail with reference to the accompanying drawings. The present invention may, however, be embodied in different forms and should not be construed as limited to the exemplary embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and exemplary embodiments of the present invention.

The drawings are not necessarily to scale and in some instances, proportions may have been exaggerated in order to clearly illustrate features of the exemplary embodiments. When a first layer is referred to as being "on" a second layer or "on" a substrate, it not only refers to a case where the first layer is formed directly on the second layer or the substrate, but also a case where a third layer exists between the first layer and the second layer or the substrate.

In accordance with exemplary embodiments of the present invention, an oxidation prevention barrier is formed to surround a first region in which a buried gate is formed, thereby preventing the buried gate from being degraded during a subsequent thermal process, such as an oxidation process. Hereinafter, a first region will be referred to as a "memory cell region", and a second region adjacent to the first region will be referred to as a "peripheral circuit region".

Figure 2A:
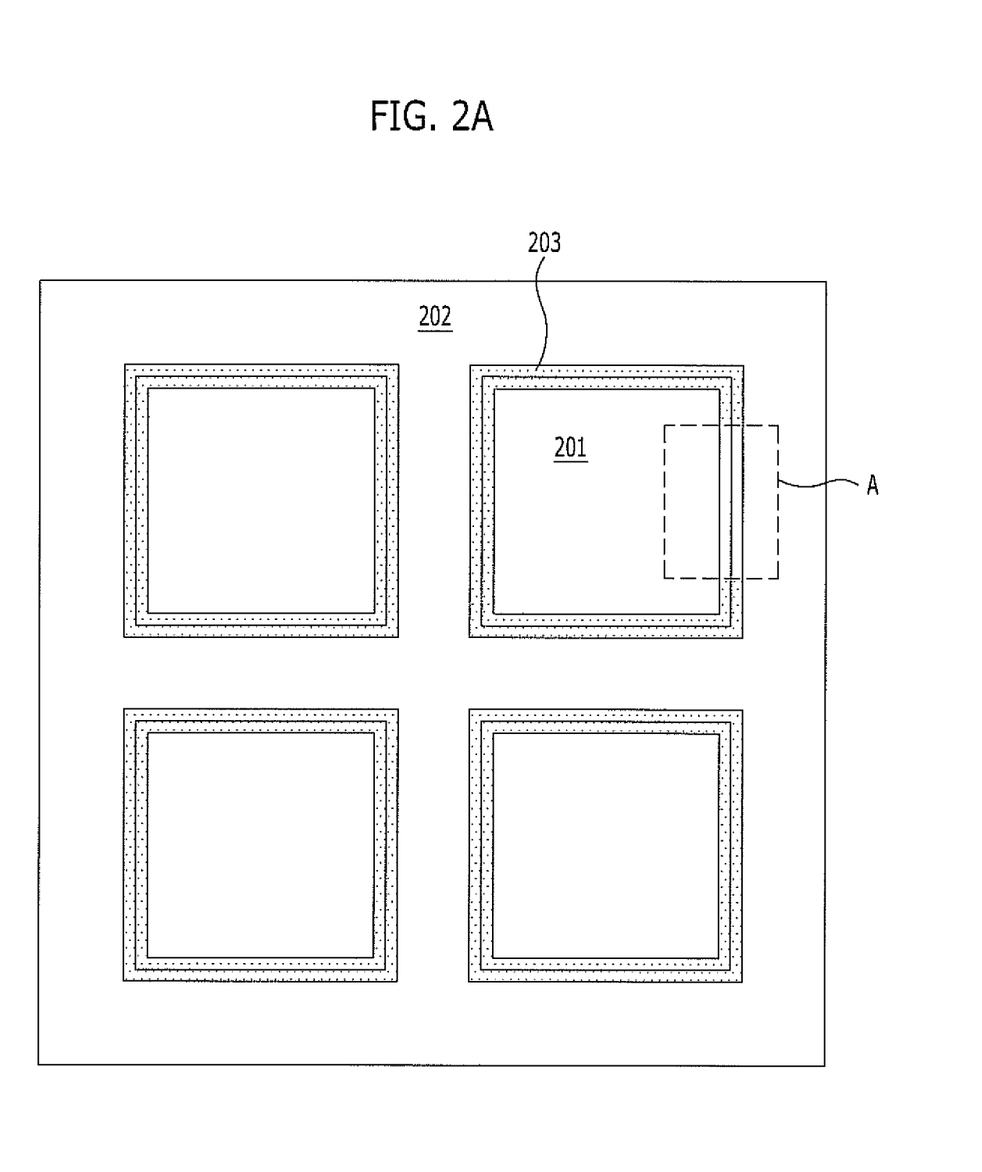
FIG. 2A is a plan view illustrating a memory cell region and a peripheral circuit region in accordance with a first exemplary embodiment of the present invention.
Figure 2B:
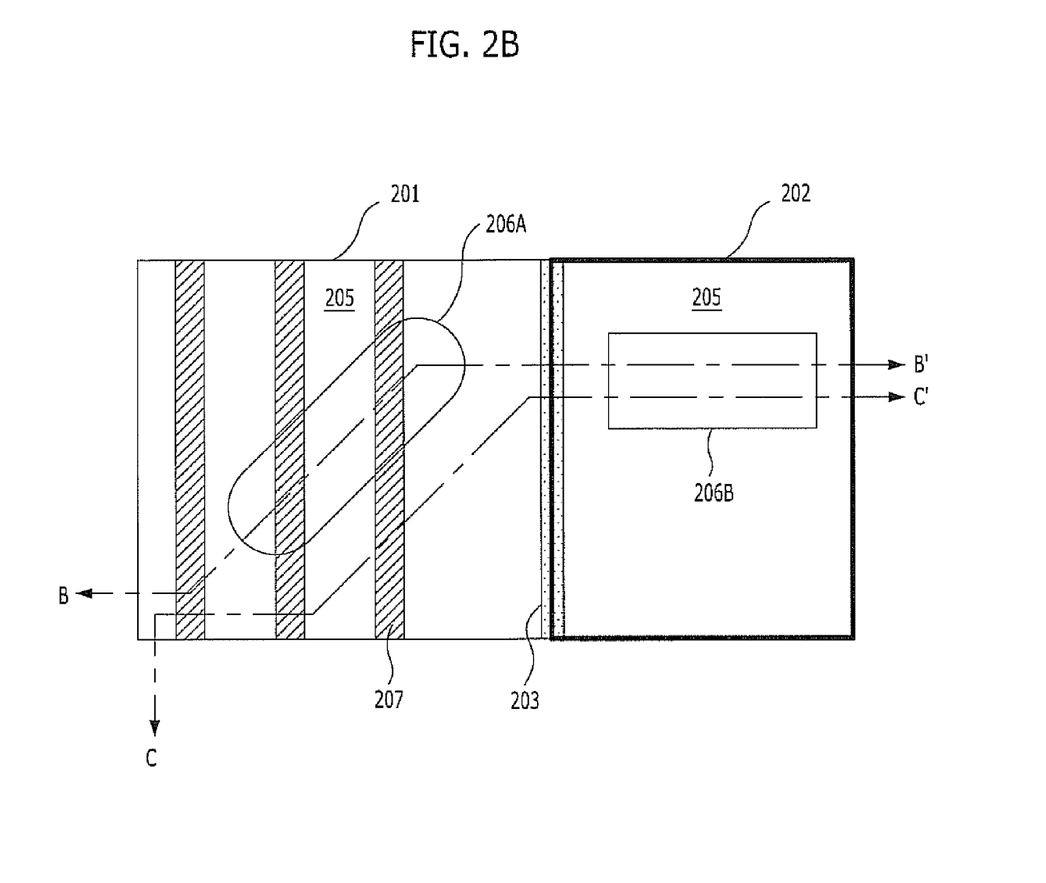
FIG. 2B is a plan view illustrating a boundary region (indicated by reference symbol "A" in FIG. 2A) between the memory cell region and the peripheral circuit region.

FIG. 2A is a plan view illustrating a memory cell region and a peripheral circuit region in accordance with a first exemplary embodiment of the present invention, and FIG. 2B is a plan view illustrating a boundary region (indicated by reference symbol "A" in FIG. 2A) between the memory cell region and the peripheral circuit region.

Referring to FIG. 2A, a memory cell region 201 and a peripheral circuit region 202 are arranged adjacent to each other, and an oxidation prevention barrier 203 surrounding the memory cell region 201 is formed. The oxidation prevention barrier 203 is formed in a boundary region between the peripheral circuit region 202 and the memory cell region 201. In another exemplary embodiment, the oxidation prevention barrier 203 may be formed in the peripheral circuit region 202 to surround an edge of the memory cell region 201.

Referring to FIG. 2B, active regions 206A and 206B, defined by an isolation layer 205, are formed in the memory cell region 201 and the peripheral circuit region 202. The active region 206A formed in the memory cell region 201 and the active region 206B formed in the peripheral circuit region 202 may be different in size and shape.

In the memory cell region 202, a plurality of buried gates 207 are formed to fill trenches which are formed by etching the active region 206A and the isolation layer 205. The buried gates 207 may be formed in a line-type pattern, wherein the buried gates 207 form linear structures that are parallel to one another and separated by a certain distance.

Further, as shown in FIG. 2B, the oxidation prevention barrier 203 may be formed in a boundary region between the peripheral circuit region 202 and the memory cell region 201.

Figure 2C:
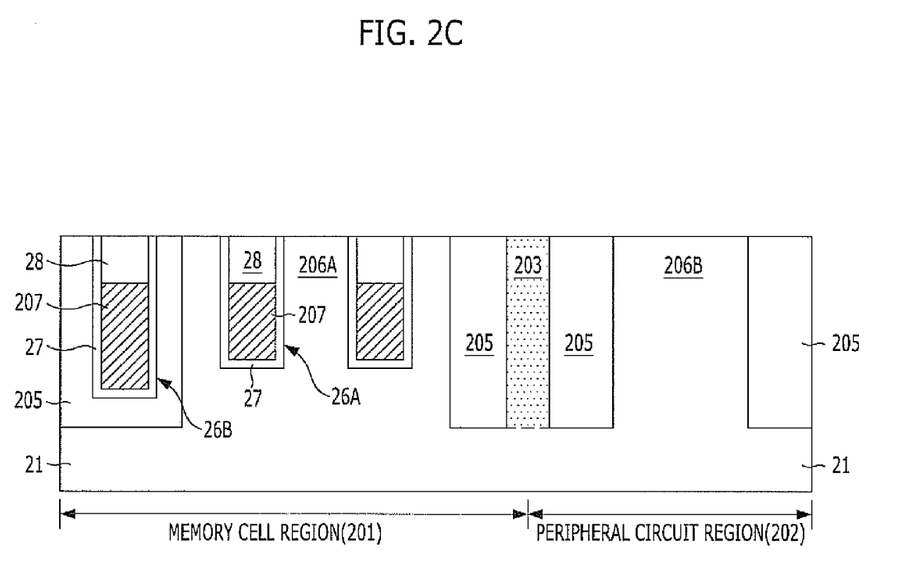
FIG. 2C is a cross-sectional view taken along line B-B' of FIG. 2B.
Figure 2D:
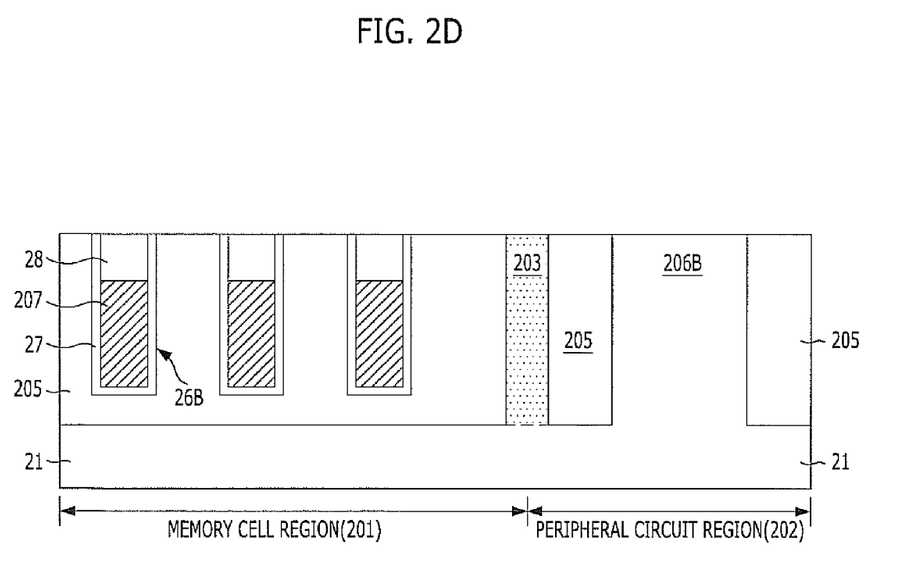
FIG. 2D is a cross-sectional view taken along line C-C' of FIG. 2B.

FIG. 2C is a cross-sectional view taken along line B-B' of FIG. 2B, and FIG. 2D is a cross-sectional view taken along line C-C' of FIG. 2B.

Referring to FIGS. 2C and 2D, a semiconductor substrate 21 is prepared. In the semiconductor substrate 21, the memory cell region 201 and the peripheral circuit region 202 are defined. Isolation layers 205 are formed in the memory cell region 201 and the peripheral circuit region 202 in order to isolate elements formed in the respective regions. The isolation layers 205 may define a plurality of active regions 206A and 206B in the respective regions.

In the memory cell region 201, the active region 206A and the isolation layer 205 may be simultaneously etched to form an active region trench 26A and an isolation layer trench 26B. Subsequently, buried gates 207, partially filling the active region trench 26A and the isolation layer trench 26B, are formed. That is, the buried gates 207 are formed in a portion of the active region trench 26A formed in the active region 206A and also in a portion of the isolation layer trench 26B formed in the isolation layer 205. Further, the active region trench 26A and the isolation layer trench 26B may be formed to extend in the same direction. For example, the active region trench 26A may have a linear shape parallel to the isolation layer trench 26B. However, the isolation layer trench 26B formed in the isolation layer 205 may be deeper than the active region trench 26A formed in the active region 206A.

Additionally, interlayer dielectric layers 28 are formed on the buried gates 207 to gap-fill the remaining portions of the active region trench 26A and the isolation layer trench 26B. Moreover, gate dielectric layers 27 may be formed between the buried gates 207 and the active trench 26A and the isolation layer trench 26B.

The buried gate 207 includes at least one metal layer selected from the group consisting of a titanium nitride (TiN) layer, a tantalum nitride (TaN) layer, a tantalum carbon nitride (TaCN) layer, a tungsten nitride (WN) layer, and a tungsten (W) layer. Accordingly, a sheet resistance (Rs) of the buried gate 207 is remarkably reduced, and thus, the buried gate 207 may be formed in a sub 30-nm trench. For example, the buried gate 207 may have a structure in which a titanium nitride (TiN) layer and a tungsten (W) layer are stacked. In this case, the titanium nitride layer may be formed using an atomic layer deposition (ALD).

The interlayer dielectric layer 28 may have a monolayer structure, including an oxide layer or a nitride layer. The oxide layer may include a spin on dielectric (SOD) layer, and, in particular, the SOD layer may be formed using polysilazane (PSZ). Or, where the interlayer dielectric layer 28 is a nitride layer, the nitride layer may include a silicon nitride layer.

The peripheral circuit region 202 is arranged adjacent to the memory cell region 201, and an oxidation prevention barrier 203 surrounding the memory cell region 201 is formed. More specifically, the oxidation prevention barrier 203 is formed in a boundary region between the memory cell region 201 and the peripheral circuit region 202. In another embodiment, the oxidation prevention barrier 203 may be formed at the edge of the peripheral circuit region 202 to surround the memory cell region 201.

In accordance with the first exemplary embodiment of the present invention, the oxidation prevention barrier 203 can prevent the buried gates 207 from being degraded when a subsequent thermal process is performed on the peripheral circuit region 202.

Figure 3A:
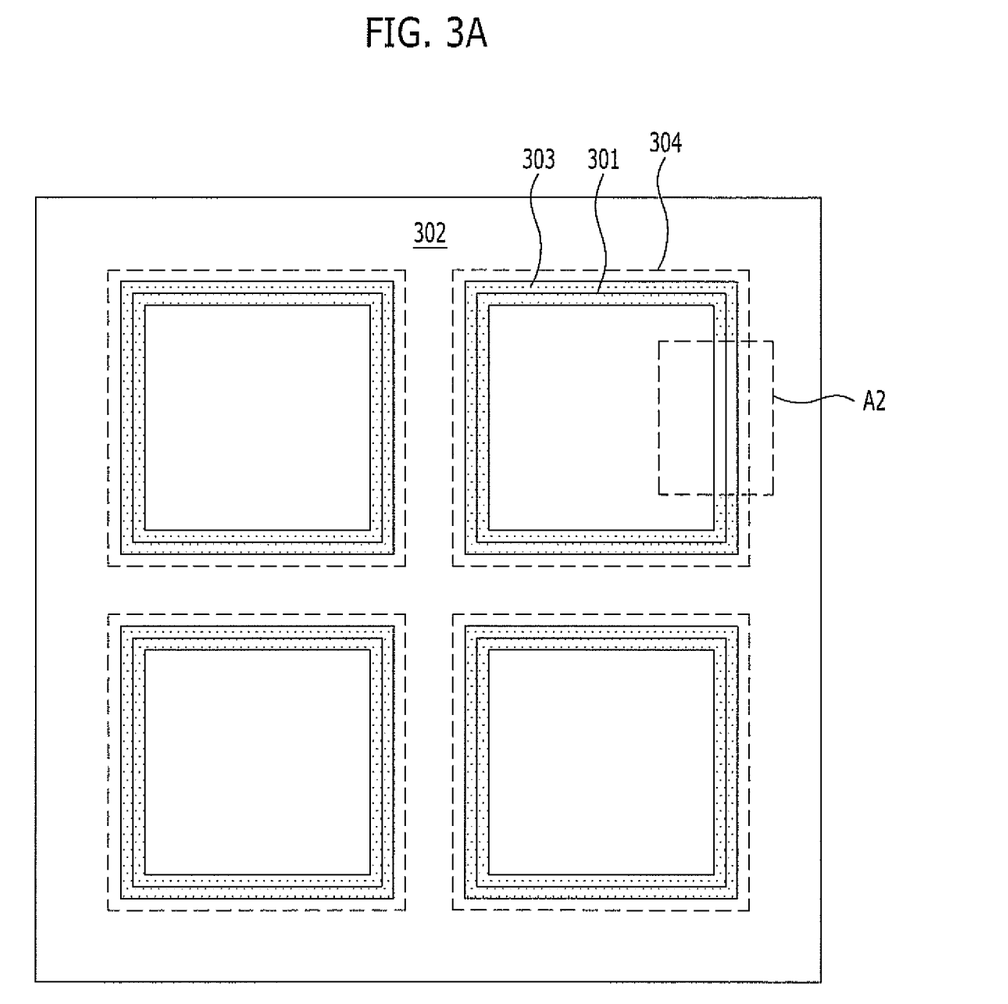
FIG. 3A is a plan view illustrating a memory cell region and a peripheral circuit region in accordance with a second exemplary embodiment of the present invention.
Figure 3B:
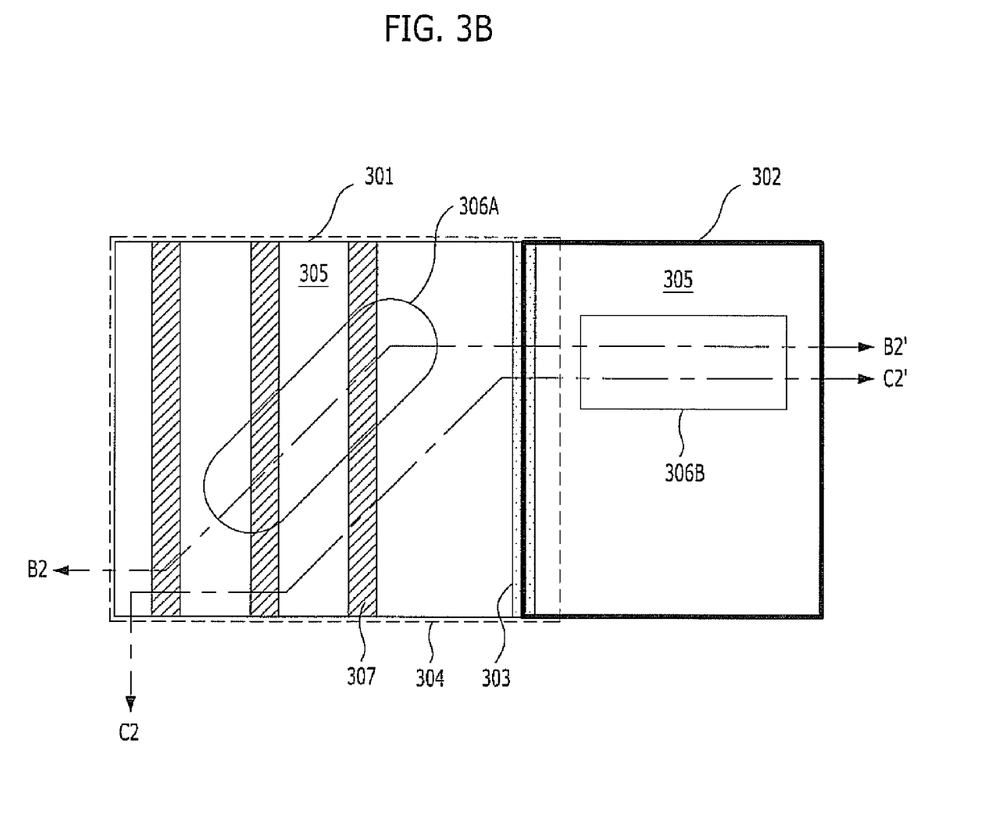
FIG. 3B is a plan view illustrating a boundary region (indicated by reference symbol "A2" in FIG. 3A) between the memory cell region and the peripheral circuit region.

FIG. 3A is a plan view illustrating a memory cell region and a peripheral circuit region in accordance with a second exemplary embodiment of the present invention, and FIG. 3B is a plan view illustrating a boundary region (indicated by reference symbol "A2" in FIG. 3A) between the memory cell region and the peripheral circuit region.

Referring to FIG. 3A, a memory cell region 301 and a peripheral circuit region 302 are arranged adjacent to each other, and an oxidation prevention barrier 303 surrounding the memory cell region 301 is formed. An oxidation prevention layer 304 is formed to cover the memory cell region 301. The oxidation prevention barrier 303 is formed in a boundary region between the peripheral circuit region 302 and the memory cell region 301. In another embodiment, the oxidation prevention barrier 303 may be formed in the peripheral circuit region 302 to surround an edge of the memory cell region 301.

Referring to FIG. 3B, active regions 306A and 306B, defined by an isolation layer 305, are formed in the memory cell region 301 and the peripheral circuit region 302. The active region 306A formed in the memory cell region 301 and the active region 306B formed in the peripheral circuit region 302 may be different in size and shape.

In the memory cell region 302, a plurality of buried gates 307 are formed to fill trenches which are formed by etching the active region 306A and the isolation layer 305. The buried gates 307 may be formed in a line-type pattern, wherein the buried gates 307 form linear structures that are parallel to one another and separated by a certain distance.

Further, as shown in FIG. 3B, the oxidation prevention barrier 303 may be formed in a boundary region between the peripheral circuit region 302 and the memory cell region 301.

Figure 3C:
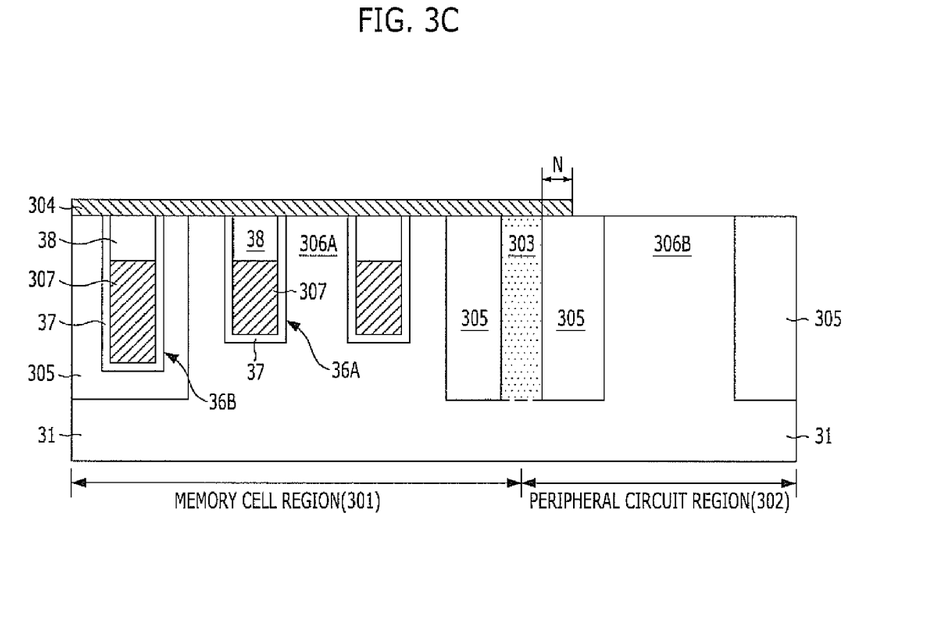
FIG. 3C is a cross-sectional view taken along line B2-B2' of FIG. 3B.
Figure 3D:
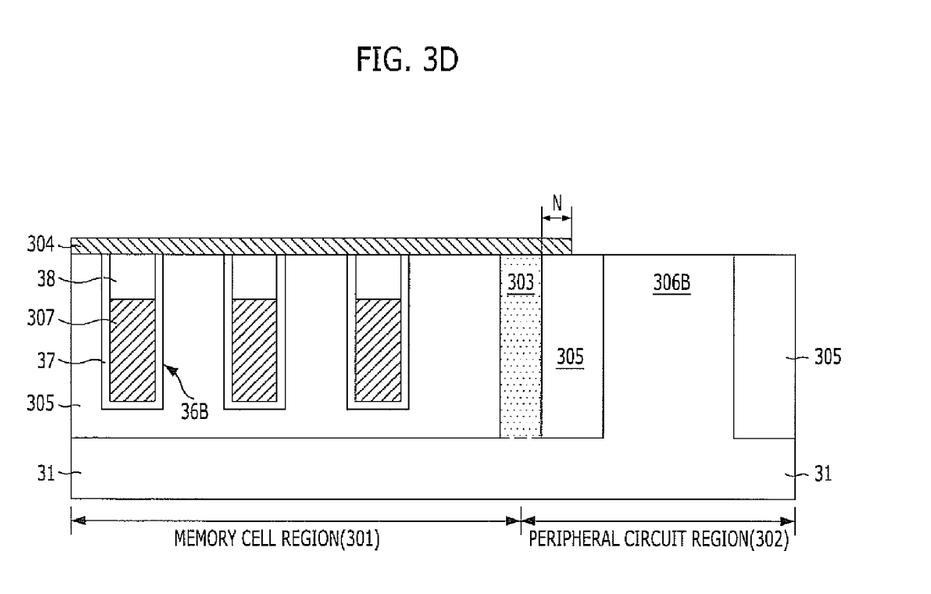
FIG. 3D is a cross-sectional view taken along line C2-C2' of FIG. 3B.

FIG. 3C is a cross-sectional view taken along line B2-B2' of FIG. 3B, and FIG. 3D is a cross-sectional view taken along line C2-C2' of FIG. 3B.

Referring to FIGS. 3C and 3D, a semiconductor substrate 31 is prepared. In the semiconductor substrate 31, the memory cell region 301 and the peripheral circuit region 302 are defined. Isolation layers 305 are formed in the memory cell region 301 and the peripheral circuit region 302 in order to isolate elements formed in the respective regions. The isolation layers 305 may define a plurality of active regions 306A and 306B in the respective regions.

In the memory cell region 301, the active region 306A and the isolation layer 305 may be simultaneously etched to form an active region trench 36A and an isolation layer trench 36B. Subsequently, buried gates 307, partially filling the active region trench 36A and the isolation layer trench 36B, are formed. That is, the buried gates 307 are formed in a portion of the active region trench 36A formed in the active region 306A and also in a portion of the isolation layer trench 36B formed in the isolation layer 305. Further, the active region trench 36A and the isolation layer trench 36B may be formed to extend in the same direction. For example, the active region trench 36A may have a linear shape parallel to the isolation layer trench 36B. However, the isolation layer trench 36B formed in the isolation layer 305 may be deeper than the active region trench 36A formed in the active region 306A.

Additionally, interlayer dielectric layers 38 are formed on the buried gates 307 to gap-fill the remaining portions of the active region trench 36A and the isolation layer trench 36B. Moreover, gate dielectric layers 37 may be formed between the buried gates 307 and the active trench 36A and the isolation layer trench 36B.

The buried gate 307 includes at least one metal layer selected from the group consisting of a titanium nitride (TiN) layer, a tantalum nitride (TaN) layer, a tantalum carbon nitride (TaCN) layer, a tungsten nitride (WN) layer, and a tungsten (W) layer. Accordingly, a sheet resistance (Rs) of the buried gate 307 is remarkably reduced, and thus, the buried gate 307 may be formed in a sub 30-nm trench. For example, the buried gate 307 may have a structure in which a titanium nitride (TIN) layer and a tungsten (W) layer are stacked. In this case, the titanium nitride layer may be formed using an atomic layer deposition (ALD).

The interlayer dielectric layer 38 may have a monolayer structure, including an oxide layer or a nitride layer. The oxide layer may include an SOD layer, and in particular, the SOD layer may be formed using polysilazane (PSZ). Or, where the interlayer dielectric layer 38 is a nitride layer, the nitride layer may include a silicon nitride layer.

The peripheral circuit region 302 is arranged adjacent to the memory cell region 301, and an oxidation prevention barrier 303 surrounding the memory cell region 301 is formed. More specifically, the oxidation prevention barrier 303 is formed in a boundary region between the memory cell region 301 and the peripheral circuit region 302. In another embodiment, the oxidation prevention barrier 303 may be formed at the edge of the peripheral circuit region 302 to surround the memory cell region 301.

Furthermore, an oxidation prevention layer 304 is formed to cover the semiconductor substrate 31 of the memory cell region 301. Thus, the oxidation prevention layer 304 prevents the buried gates 307 from being degraded during a subsequent thermal process, such as an oxidation process. The oxidation prevention layer 304 may include a nitride layer, such as a silicon nitride layer, having an excellent oxygen penetration prevention effect. For example, the oxidation prevention layer 304 may be a silicon nitride layer formed by a low pressure chemical vapor deposition (LPCVD) process, so that the silicon nitride layer has an excellent oxidation resistance characteristic. The oxidation prevention layer 304 may have a thickness ranging from approximately 50 Å to approximately 500 Å.

The oxidation prevention layer 304 may have a width so that it covers the oxidation prevention barrier 303. That is, end portions of the oxidation prevention layer 304 may extend to the isolation layer 305 formed at the edge of the peripheral circuit region 302. Since the oxidation prevention layer 304 sufficiently covers the oxidation prevention barrier 303, as well as the memory cell region 301, oxidation of the buried gates 307 may be further prevented. As shown in FIGS. 3C and 3D, the end portions of the oxidation prevention layer 304 may extend from the edge of the oxidation prevention barrier 303 in a direction of the peripheral circuit region 302 by a certain width N. The width N may be at least 1 nm or more. As such, when the width N of the oxidation prevention layer 304 covering the oxidation prevention barrier 303 is 1 nm or more, it is possible to further prevent an oxidizing agent from diffusing along the interface between the oxidation prevention layer 304 and the oxidation prevention barrier 303.

In accordance with the second exemplary embodiment of the present invention, the oxidation prevention barrier 303 can prevent the buried gates 307 from being degraded when a subsequent thermal process is performed on the peripheral circuit region 302. Furthermore, the oxidation prevention layer 304 can further prevent the buried gates 307 from being degraded.

FIGS. 4A to 4F are cross-sectional views taken along line 132-132' of FIG. 3B illustrating a method for fabricating a second exemplary embodiment of the present invention, and FIGS. 5A to 5F are cross-sectional views taken along line C2-C2' of FIG. 313 illustrating a method for fabricating the second exemplary embodiment of the present invention.

Figure 4A:
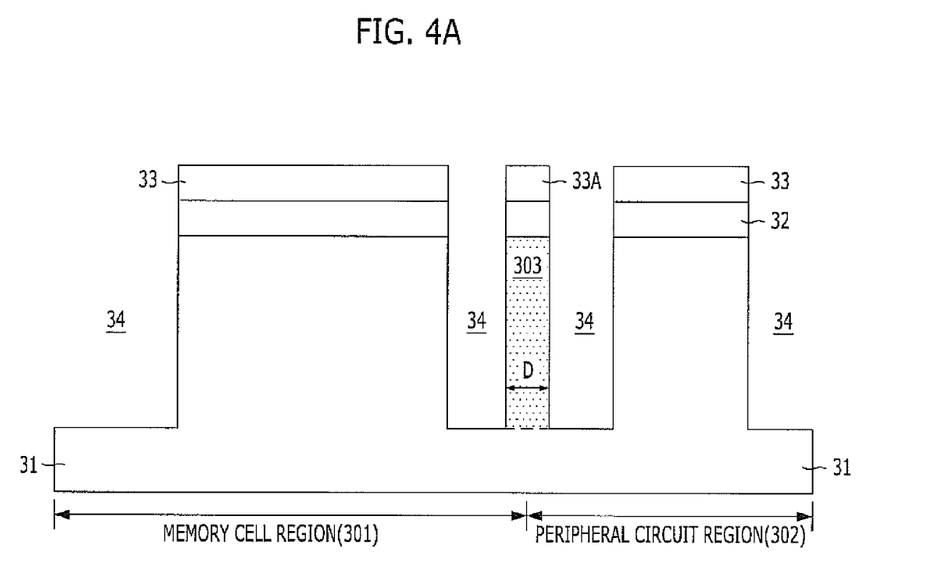
FIGS. 4A to 4F are cross-sectional views taken along line B-B' of FIG. 3B illustrating a method for fabricating the second exemplary embodiment of the present invention.
Figure 5A:
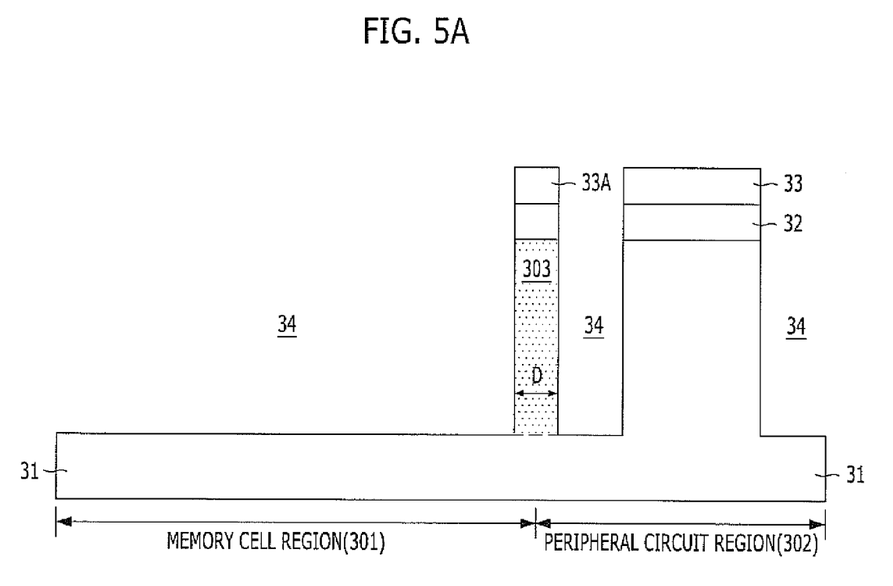
FIGS. 5A to 5F are cross-sectional views taken along line C-C' of FIG. 3B illustrating a method for fabricating the second exemplary embodiment of the present invention.

Referring to FIGS. 4A and 5A, a pad layer 32 is formed on the semiconductor substrate 31 in which the memory cell region 301 and the peripheral circuit region 302 are defined. The pad layer 32 may be formed by stacking a pad oxide layer and a pad nitride layer.

An isolation mask 33 is formed using a photoresist layer. A barrier mask 33A for forming an oxidation prevention barrier is formed at the same time when the isolation mask 33 is formed. At this time, the barrier mask 33A is formed in a boundary region between the memory cell region 301 and the peripheral circuit region 302, and thus, has a ring shape surrounding the memory cell region 301. In another embodiment, the barrier mask 33A may be formed at an edge of the peripheral circuit region 302, and thus, similarly forms a ring shape to surround the memory cell region 301.

The pad layer 32 is etched using the isolation mask 33 and the barrier mask 33A. Then, the semiconductor substrate 31 is etched to a certain depth. Through these processes, isolation trenches 34 for forming an isolation region are formed in the semiconductor substrate 31. In addition, the oxidation prevention barrier 303 is formed in the boundary region between the peripheral circuit region 302 and the memory cell region 301 by the barrier mask 33A. The oxidation prevention barrier 303 is formed of the same material as the semiconductor substrate 31. Hence, when the semiconductor substrate 31 is, for example, a silicon substrate, the oxidation prevention barrier 303 is a silicon barrier.

The width D of the oxidation prevention barrier 303 may be in the range of approximately 1 nm to approximately 300 nm. For example, the thickness of the oxidation prevention barrier 303 may be set in consideration of the degree of oxidation expected during a subsequent gate oxidation process on the peripheral circuit region 302. When a gate dielectric layer formed by a subsequent gate oxidation process has a thickness of 1 nm, the oxidation prevention barrier 303 may be formed to have a width greater than at least 1 nm.

Figure 4B:
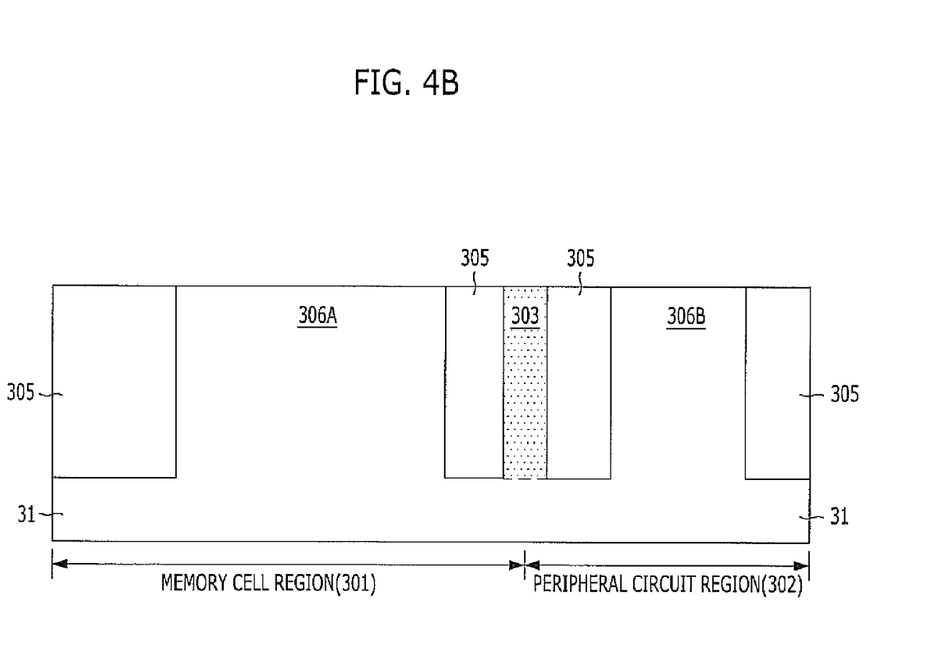
Figure 5B:
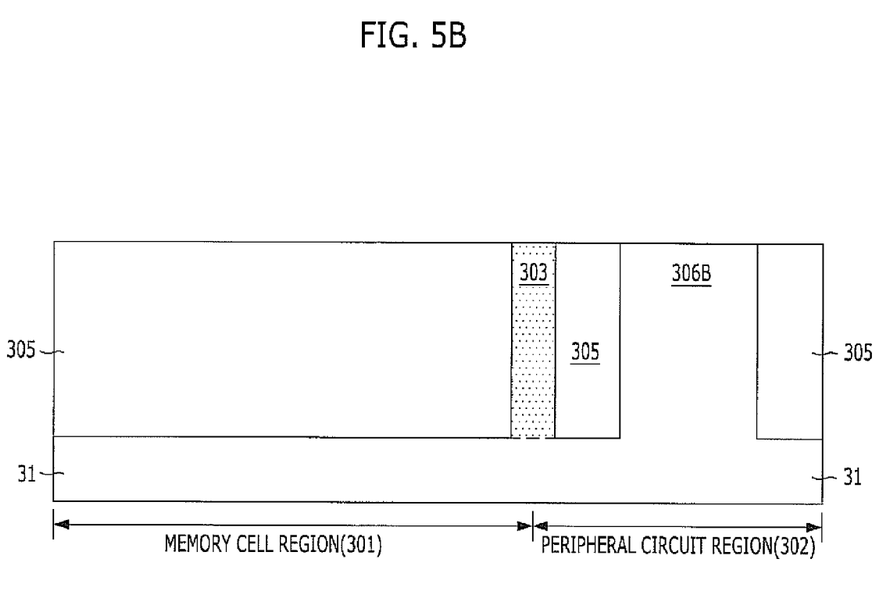

Referring to FIGS. 4B and 5B, the isolation mask 33 is removed and a gap-fill insulation layer is deposited to gap-fill the isolation trenches 34. The pad layer 32 is removed by a planarization process, such a chemical mechanical polishing (CMP). Accordingly, the isolation layer 305, filling the isolation trenches 34, is formed. The gap-fill insulation layer used as the isolation layer 305 may include an oxide layer, such as a high density plasma (HDP) oxide layer or an SOD layer. The active regions 306A and 306B are defined in the memory cell region 301 and the peripheral circuit region 302. The active region 306A formed in the memory cell region 301 and the active region 306B formed in the peripheral circuit region 302 may be different in shape, size, and orientation.

Once the isolation layer 305 is formed, the oxidation prevention barrier 303 is formed in the boundary region between the peripheral circuit region 302 and the memory cell region 301.

Figure 4C:
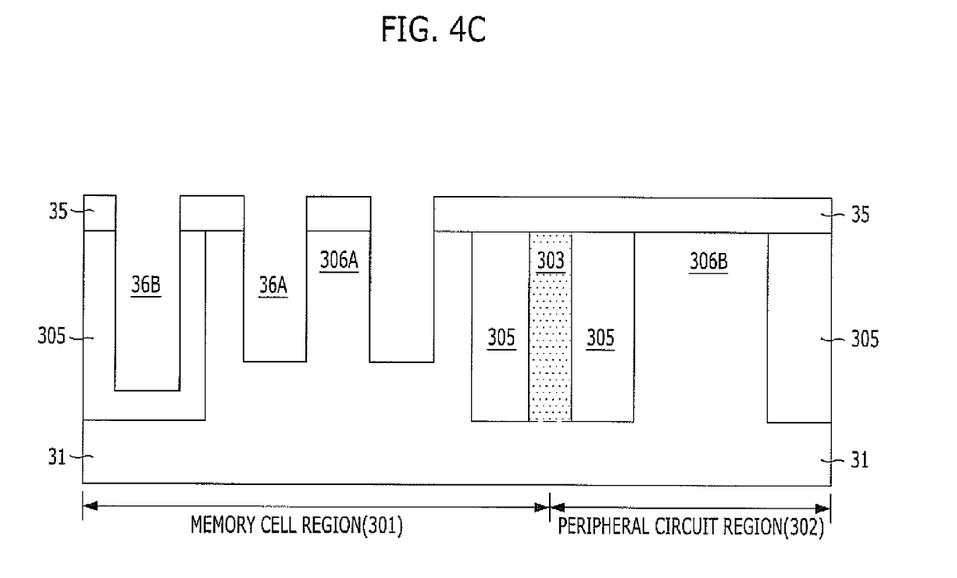
Figure 5C:
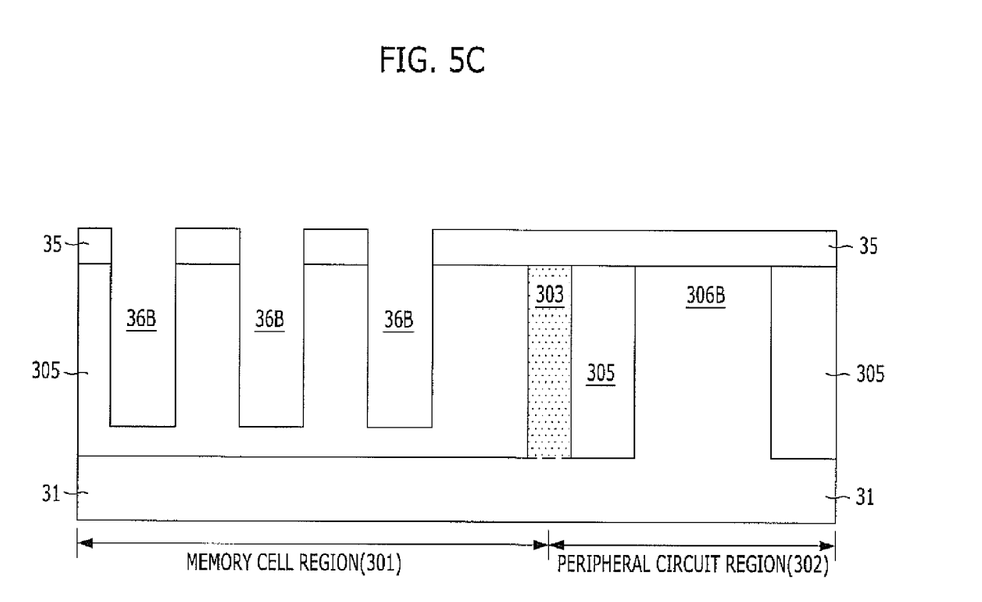

Referring to FIGS. 4C and 5C, the active region trench 36A and the isolation layer trench 36B (herein, also referred to as "buried trenches") in which the buried gates are to be buried are formed in the memory cell region 301 through an etching process using a hard mask layer 35 as an etching barrier. In this case, the buried trenches 36A and 6B may be formed by etching the isolation layer 305, as well as the active region 306A. Further, the isolation layer 305 and the active region 306A may be simultaneously etched to form the buried trenches 36A and 36B. Since the buried gates generally have a line-type pattern, the buried trenches 36A and 36B also have a line-type pattern. Due to the line-type pattern of the buried trenches 36A and 36B, the buried trenches 36A and 36B may cross both the active region 306A and the isolation layer 305 in the same line. That is, any one of the buried trenches 36A and 36B may cross both the active region 306A and the isolation layer 306B. Also, the buried trench 36A formed in the active region 306A and the buried trench 36B formed in the isolation layer 305 may extend in the same direction. That is, the buried trench 36A formed in the active region 306A and the buried trench 36B formed in the isolation layer 305 may have linear shapes that are parallel to each other. However, because the etch selectivity of the active region 306A is different from the etch selectivity of the isolation layer 305, the isolation layer 305 may be further etched. Hence, the buried trench 36B formed in the isolation layer 305 may be deeper. For example, the buried trench 36A formed in the active region 306A may have a depth ranging from approximately 1,000 Å to approximately 1,500 Å, and the buried trench 36B formed in the isolation layer 305 may have a depth ranging from approximately 1,500 Å to approximately 2,000 Å.

The etching process for forming the buried trenches 36A and 36B uses the hard mask layer 35 as an etching barrier. The hard mask layer 35 is patterned by a photoresist pattern (not shown). The hard mask layer 35 may be formed of a material having a high etch selectivity with respect to the semiconductor substrate 31, so that the semiconductor substrate 31 can be etched using the hard mask layer 35 as an etching barrier. For example, the hard mask layer 35 may include a structure in which an oxide layer and a nitride layer are stacked. Before etching the semiconductor substrate 31, the photoresist pattern used to pattern the hard mask layer 35 may be stripped.

Figure 4D:
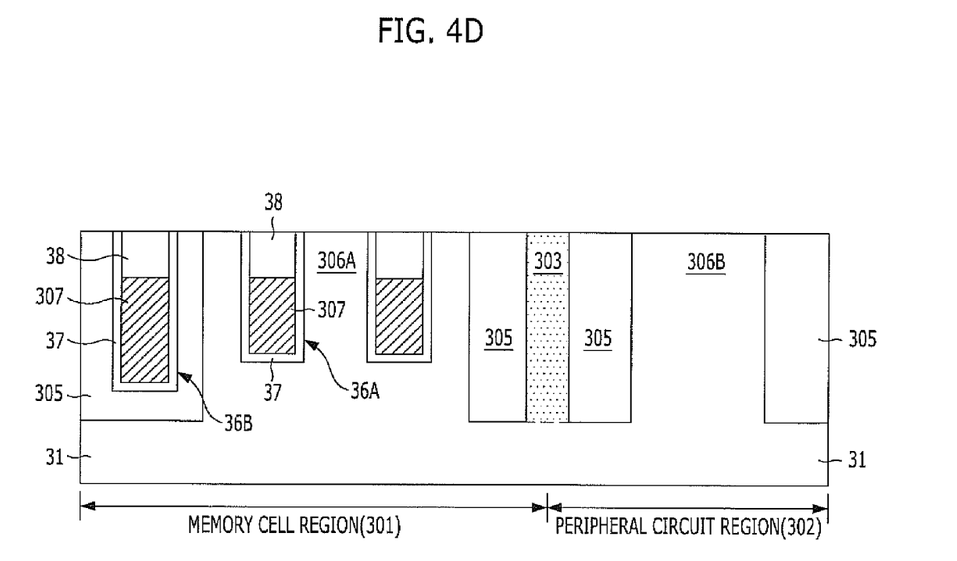
Figure 5D:
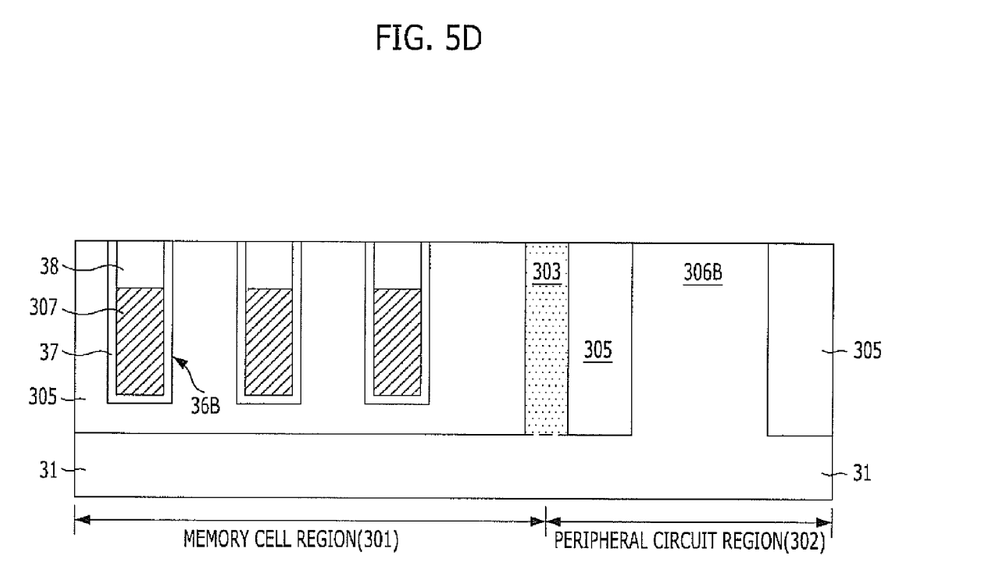

Referring to FIGS. 4D and 5D, gate dielectric layers 37 are formed on sidewalls and bottom surfaces of the buried trenches 36A and 36B. The gate dielectric layers 37 may be formed by oxidizing the surfaces of the buried trenches 36A and 36B. For example, the oxidation process may be performed by a thermal oxidation process or a radical oxidation process solely or in a combination manner. As a result of the oxidation process, where the semiconductor substrate 31 is a silicon substrate, a silicon oxide ($Si_xO_y$) layer may be formed. Further, the silicon oxide layer formed by the oxidation process may be nitrided.

Buried gates 307 filling portions of the buried trenches 36A and 36B are formed on the gate dielectric layers 37, and interlayer dielectric layers 38 are formed to gap-fill the upper portions of the buried trenches 307.

A method for forming the buried gates 07 and the interlayer dielectric layers 38 is described below.

A metal layer filling the buried trenches 36A and 36B is deposited on the resultant structure, including the hard mask layer 35. The metal layer may include at least one layer selected from the group consisting of a titanium nitride layer (TiN), a tantalum nitride (TaN) layer, a tantalum carbon nitride (TaCN) layer, a tungsten nitride (WN) layer, and a tungsten (W) layer. The metal layer may also be formed by stacking a titanium nitride (TIN) layer and a tungsten (W) layer.

A planarization process, such as a chemical mechanical polishing (CMP), is performed on the metal layer until the surface of the hard mask layer 35 (shown in FIG. 4C) is exposed. The metal layer is then recessed through an etchback process. Accordingly, the metal layer remains so that it partially fills the buried trenches 36A and 36B, and the remaining metal layer becomes the buried gates 307. The buried gates 307 may have a height ranging from approximately 500 Å to approximately 1,300 Å.

An interlayer dielectric layer 38 is formed on the buried gates 207 until the upper portions of the buried trenches 36A and 36B are gap-filled and planarized to expose the surface of the hard mask layer 35 (shown in FIG. 4C). Accordingly, the interlayer dielectric layer 38 remains on the buried gates 307, so that it gap-fills the remaining portions of the buried trenches 36A and 36B. The interlayer dielectric layer 38 may include an oxide layer or a nitride layer. The oxide layer may include an SOD layer, and, in particular, the SOD layer may be formed using polysilazane (PSZ). Or, where the interlayer dielectric layer 38 is a nitride layer, the nitride layer may include a silicon nitride layer. Also, the interlayer dielectric layer 38 may be formed by forming a thin nitride layer conforming to the buried trenches 36A and 36B, and then gap-filling the buried trenches 36A and 36B with an oxide layer.

After forming the interlayer dielectric layer 38, the hard mask layer 35 (shown in FIG. 4C) is removed. For example, the hard mask layer 35 may be removed using a wet etching process. Also, at this time, the interlayer dielectric layer 38 may be partially removed so that its height is reduced.

Figure 4E:
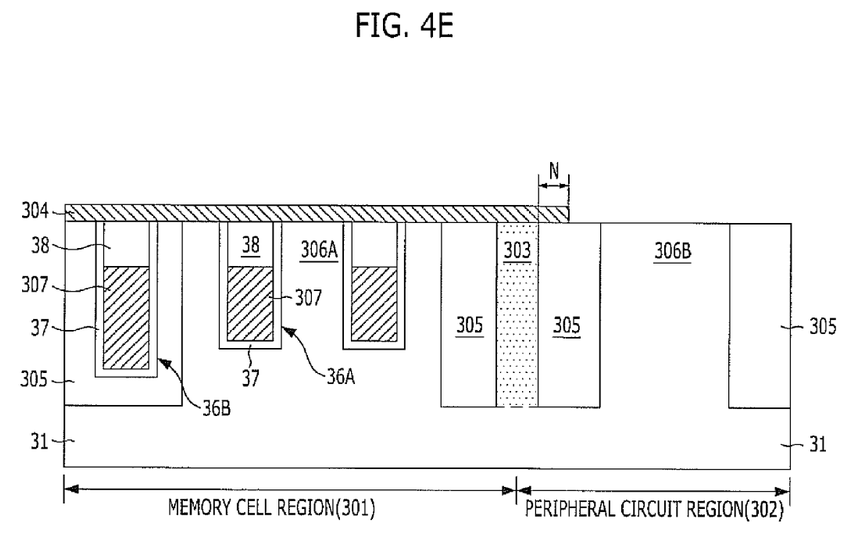
Figure 5E:
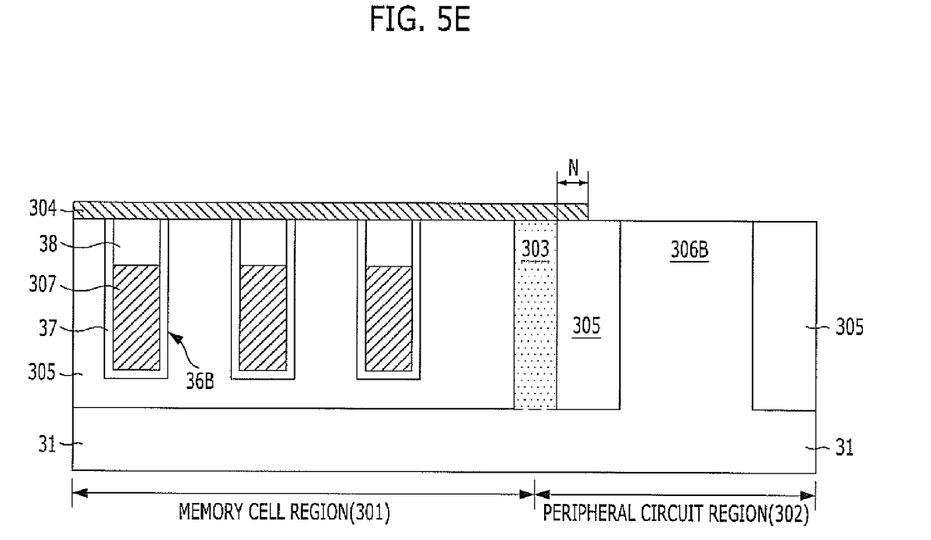

Referring to FIGS. 4E and 5E, after forming the interlayer dielectric layer 38, an oxidation prevention layer 304 is formed over the semiconductor substrate 31, including the memory cell region 301 and peripheral circuit region 302. The oxidation prevention layer 304 is then selectively etched using a peripheral open mask (not shown), which covers the memory cell region 302. Accordingly, the oxidation prevention layer 304 covering the memory cell region 301 remains. The peripheral open mask may be formed using a photoresist layer.

The oxidation prevention layer 304 may include a nitride layer. Specifically, the oxidation prevention layer 304 may be a silicon nitride layer formed by an LPCVD process having an excellent oxidation resistance characteristic. The oxidation prevention layer 304 may have a thickness ranging from approximately 50 Å to approximately 500 Å.

Next, a wet etching process or a dry etching process may be applied in order to remove the oxidation prevention layer 304 from the peripheral circuit region 302.

Since the above-described oxidation prevention layer 304 covers the entire surface of the memory cell region 301, the memory cell region 301 and the buried gates 307 can be protected during a subsequent thermal process. For example, the oxidation prevention layer 304 may prevent an oxidizing agent from diffusing through the interlayer dielectric layer 38 during a subsequent thermal process in an oxidation atmosphere, thereby preventing the degradation of the buried gates 307.

The oxidation prevention layer 304 may have a width so that it covers the oxidation prevention barrier 303. That is, end portions of the oxidation prevention layer 304 may extend to the isolation layer 305 formed at the edge of the peripheral circuit region 302. Since the oxidation prevention layer 304 sufficiently covers the oxidation prevention barrier 303, as well as the memory cell region 301, oxidation of the buried gates 307 may be further prevented. As shown in FIGS. 4E and 5E, the end portions of the oxidation prevention layer 304 may extend from the edge of the oxidation prevention barrier 303 in a direction of the peripheral circuit region 302 by a certain width N. The width N may be at least 1 nm or more. As such, when the width N of the oxidation prevention layer 304 covering the oxidation prevention barrier 303 is 1 nm or more, it is possible to further prevent an oxidizing agent from diffusing along the interface between the oxidation prevention layer 304 and the oxidation prevention barrier 303.

Figure 4F:
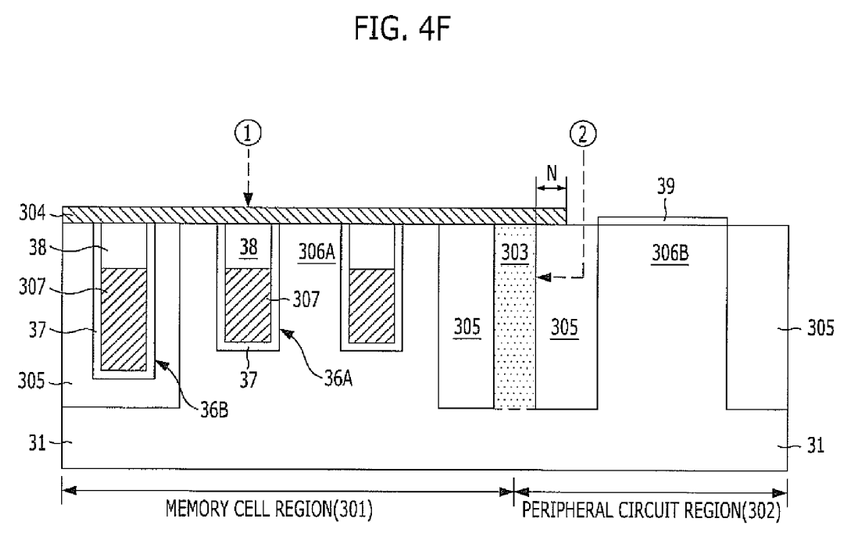
Figure 5F:
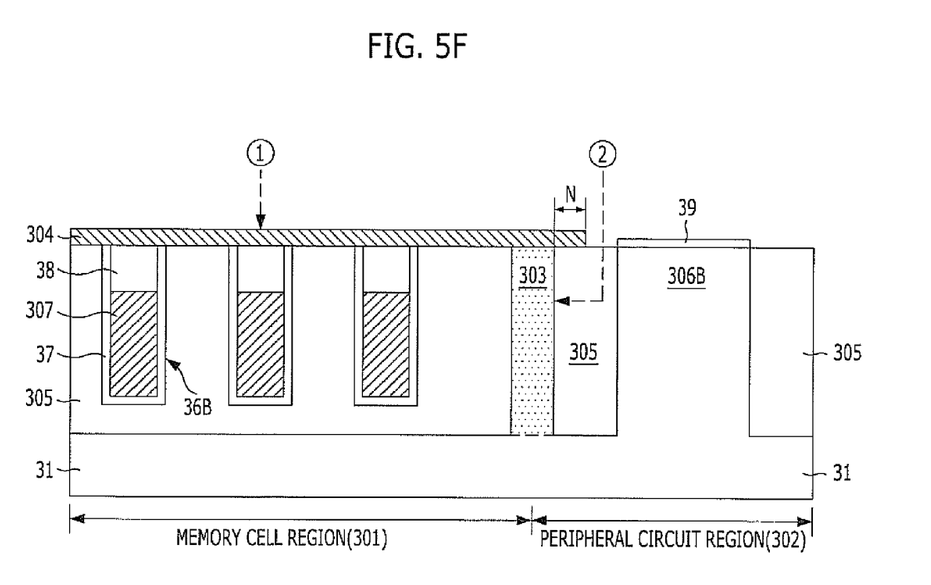

Referring to FIGS. 4F and 5F, the peripheral open mask is removed and a subsequent thermal process is performed.

For example, the subsequent thermal process may include a gate oxidation process for forming a peripheral gate dielectric layer 39 for a transistor in the peripheral circuit region 302.

Since the oxidation prevention layer 304 covers the entire surface of the memory cell region 301 when forming the peripheral gate dielectric layer 39, the oxidizing agent cannot pass through the interlayer dielectric layer 9 (see reference numeral ①). Accordingly, the oxidation of the buried gates 307 under the interlayer dielectric layer 38 can be prevented.

In addition, since the oxidation prevention barrier 303 is provided in the boundary region 303 between the peripheral circuit region 302 and the memory cell region 301, the diffusion of the oxidizing agent through the active region 306A and the isolation layer 305 of the memory cell region 301 can be prevented (see reference numerals ②). Accordingly, the oxidation of the buried gates 307 formed in the memory cell region 301 can be prevented.

During the oxidation process for forming the peripheral gate dielectric layer 39, the sidewalls of the oxidation prevention barrier 303 adjacent to the isolation layer 305 may be partially oxidized. However, since the oxidation prevention barrier 303 is formed to have a sufficient width according to the thickness of the peripheral gate dielectric layer 39, the oxidation prevention barrier 303 can withstand the oxidation process and continue to prevent an oxidizing agent from passing through to memory cell region 301.

In accordance with the exemplary embodiments of the present invention, even though the semiconductor substrate, including buried gates, is exposed to a subsequent thermal process, such as an oxidation process, the degradation of the buried gates can be prevented by forming the oxidation prevention barrier. Moreover, the degradation of the buried gates can be further prevented by forming the oxidation prevention layer. Consequently, it is possible to ensure the reliability of the gate dielectric layer of a cell transistor formed in a memory cell region and also prevent degradation of the characteristics of the cell transistor.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, the method comprising:
preparing a substrate having a first region and a second region;
forming an oxidation prevention barrier surrounding the first region and formed of a material substantially identical to that of the substrate;
forming an isolation layer after the oxidation prevention barrier is formed; and
forming a buried gate in the first region.

2. The method of claim 1, wherein the oxidation prevention barrier is formed in a boundary region between the first region and the second region.

3. The method of claim 1, wherein the oxidation prevention barrier comprises silicon.

4. The method of claim 1, wherein the oxidation prevention barrier has a width ranging from approximately 1 nm to approximately 300 nm.

5. The method of claim 1, wherein the forming of the oxidation prevention barrier comprises:
etching the substrate to form the oxidation prevention barrier and an isolation trench at the same time; and
wherein the forming of the isolation layer comprises:
forming the isolation layer gap-filling the isolation trench.

6. The method of claim 5, wherein the etching of the substrate comprises:
forming a pad layer over the substrate;
forming an isolation mask over the pad layer, the isolation mask being merged with a barrier mask covering an upper portion of the boundary region between the first region and the second region;
etching the pad layer using the isolation mask as an etching barrier; and
etching the substrate exposed, after the pad layer is etched.

7. The method of claim 5, wherein the forming of the buried gate comprises:
forming a buried trench by etching an active region, which is defined by the isolation layer formed in the first region, and etching the isolation layer;
depositing a metal layer over the substrate to fill the buried trench; and
sequentially performing a planarization process and a recess process on the metal layer.

8. The method of claim 7, further comprising forming an interlayer dielectric layer over the buried gate to gap-fill the buried trench.

9. The method of claim 1, wherein the first region comprises a memory cell region, and the second region comprises a peripheral circuit region.

10. A method for fabricating a semiconductor device, the method comprising:
preparing a substrate having a first region and a second region;
forming an oxidation prevention barrier surrounding the first region and formed of a material substantially identical to that of the substrate;
forming an isolation layer after the oxidation prevention barrier is formed;
forming a buried gate in the first region; and
forming an oxidation prevention layer covering an upper portion of the first region.

11. The method of claim 10, wherein the oxidation prevention barrier is formed in a boundary region between the first region and the second region.

12. The method of claim 10, wherein the oxidation prevention barrier comprises silicon.

13. The method of claim 10, wherein the oxidation prevention barrier has a width ranging from approximately 1 nm to approximately 300 nm.

14. The method of claim 10, wherein the oxidation prevention layer covers the entire first region and the oxidation prevention barrier.

15. The method of claim 14, wherein the oxidation prevention layer covers the oxidation prevention barrier and extends over the second region by a width of at least 1 nm or more.

16. The method of claim 10, wherein the forming of the oxidation prevention barrier comprises:
etching the substrate to form the oxidation prevention barrier and an isolation trench at the same time; and
wherein the forming of the isolation layer comprises:
forming the isolation layer gap-filling the isolation trench.

17. The method of claim 16, wherein the etching of the substrate comprises:
forming a pad layer over the substrate;
forming an isolation mask over the pad layer, the isolation mask being merged with a barrier mask covering an upper portion of the boundary region between the first region and the second region;
etching the pad layer using the isolation mask as an etching barrier; and
etching the substrate exposed, after the pad layer is etched.

18. The method of claim 16, wherein the forming of the buried gate comprises:
forming a buried trench by etching an active region, which is defined by the isolation layer formed in the first region, or etching the isolation layer;
depositing a metal layer over the substrate to fill the buried trench; and
sequentially performing a planarization process and a recess process on the metal layer.

19. The method of claim 18, further comprising forming an interlayer dielectric layer over the buried gate to gap-fill the buried trench.

20. The method of claim 10, wherein the forming of the oxidation prevention layer comprises:
forming a material for the oxidation prevention layer covering the first and second regions;
forming a mask over the material for the oxidation prevention layer that covers the first region and opens a portion of the second region; and
etching the material for the oxidation prevention layer over the second region using the mask.

21. The method of claim 20, wherein the material for the oxidation prevention layer comprises a nitride layer.

22. The method of claim 10, wherein the first region comprises a memory cell region, and the second region comprises a peripheral circuit region.

* * * * *